(12) United States Patent
Thomas et al.

(10) Patent No.: US 8,116,118 B2
(45) Date of Patent: Feb. 14, 2012

(54) MEMORY CELL PROVIDED WITH DUAL-GATE TRANSISTORS, WITH INDEPENDENT ASYMMETRIC GATES

(75) Inventors: Olivier Thomas, Revel (FR); Maud Vinet, Rives (FR)

(73) Assignee: Commissariat a L'Energie Atomique, Paris (FR)

( * ) Notice: Subject to any disclaimer, the term of this patent is extended or adjusted under 35 U.S.C. 154(b) by 0 days.

(21) Appl. No.: 12/005,666

(22) Filed: Dec. 26, 2007

(65) Prior Publication Data
US 2008/0175039 A1   Jul. 24, 2008

(30) Foreign Application Priority Data
Dec. 28, 2006 (FR) .................................. 06 56014

(51) Int. Cl.
*G11C 11/00* (2006.01)
(52) U.S. Cl. .................................. 365/154; 365/156
(58) Field of Classification Search .................. 365/154, 365/156; 257/40
See application file for complete search history.

(56) References Cited

U.S. PATENT DOCUMENTS

| | | | | |
|---|---|---|---|---|
| 5,740,102 | A * | 4/1998 | Kawashima | 365/154 |
| 5,818,080 | A * | 10/1998 | Kuriyama | 365/154 |
| 6,442,060 | B1 | 8/2002 | Leung et al. | |
| 6,798,682 | B2 | 9/2004 | Chuang et al. | |
| 6,801,449 | B2 * | 10/2004 | Kobayashi et al. | 365/154 |
| 6,898,111 | B2 * | 5/2005 | Yamauchi | 365/154 |
| 7,177,177 | B2 * | 2/2007 | Chuang et al. | 365/154 |
| 7,313,012 | B2 * | 12/2007 | Chuang et al. | 365/154 |
| 7,362,606 | B2 * | 4/2008 | Chuang et al. | 365/154 |
| 7,408,800 | B1 * | 8/2008 | Braceras et al. | 365/154 |
| 7,417,889 | B2 * | 8/2008 | Chuang et al. | 365/154 |
| 7,511,989 | B2 * | 3/2009 | Thomas et al. | 365/154 |
| 7,522,445 | B2 * | 4/2009 | Inaba | 365/154 |
| 7,532,501 | B2 * | 5/2009 | Joshi et al. | 365/154 |
| 7,729,159 | B2 * | 6/2010 | Braceras et al. | 365/154 |
| 7,738,284 | B2 * | 6/2010 | Kim | 365/154 |
| 7,742,327 | B2 * | 6/2010 | Chuang et al. | 365/154 |

(Continued)

FOREIGN PATENT DOCUMENTS

EP    1 465 200    10/2004

OTHER PUBLICATIONS

Chua, Patent Application Publication US 2008/0283825 A1 (U.S. Appl. No. 11/547,269).*

(Continued)

*Primary Examiner* — Trong Phan
(74) *Attorney, Agent, or Firm* — Nixon Peabody LLP

(57) ABSTRACT

The invention concerns a random access memory cell comprising:
at least one first plurality of symmetrical dual-gate transistors ($TL1_T$, $TL1_F$, $TD1_T$, $TD1_F$, $TL2_T$, $TL2_F$) forming a flip-flop,
at least a first asymmetric dual-gate access transistor ($TA1_T$, $TAW1_T$) and at least a second asymmetric dual-gate access transistor ($TA1_F$, $TAW1_F$) disposed respectively between a first bit line ($BL_T$, $WBL_T$) and a first storage node (T), and between a second bit line ($BL_F$, $WBL_F$) and a second storage node (F), a first gate of the first access transistor ($TA1_T$, $TAW1_T$) and a first gate of the second access transistor ($TA1_F$, $TAW1_F$) being connected to a first word line (WL, WWL) able to route a biasing signal, a second gate ($TA1_F$, $TAW1_F$) of the first access transistor connected to the second storage node (F) and a second gate of the second access transistor connected to the first storage node (T).

15 Claims, 11 Drawing Sheets

U.S. PATENT DOCUMENTS

| | | | |
|---|---|---|---|
| 7,768,821 B2 * | 8/2010 | Thomas et al. | 365/154 |
| 7,787,285 B2 * | 8/2010 | Chuang et al. | 365/154 |
| 7,787,286 B2 * | 8/2010 | Thomas | 365/154 |
| 7,852,661 B2 * | 12/2010 | Liu | 365/154 |
| 7,903,450 B2 * | 3/2011 | Chuang et al. | 365/154 |
| 2002/0051379 A1 | 5/2002 | Deng et al. | |
| 2004/0155281 A1 | 8/2004 | Osada et al. | |
| 2006/0274569 A1 | 12/2006 | Joshi et al. | |

OTHER PUBLICATIONS

K. Takeuchi et al.: "A Study of Threshold Voltage Variation for Ultra Small Bulk and SOI CMOS", IEEE TED, vol. 48, No. 9, Sep. 2001.

M. Yamaoka, et al.: "Low Power SRAM Menu for SOC Application Using Yin-Yang-Feedback Memory Cell Technology", Symposium on VLSI circuits, Digest of Technical Papers, Honolulu, USA, Jun. 2004.

J. J. Kim et al.: Back-Gate Controlled Read SRAM with Improved Stability, IEEE SOI Conference, pp. 211-212, Hawaii, USA, 2005.

A. Chandrakasan et al.: "Design of High-Performance Microprocessor Circuits", IEEE press, pp. 285-308, FOX 2001.

Agarwal, et al.: "DRG-Cache A Data Retention Gated-Ground Cache for Low Power", DAC, pp. 473-478, Jun. 2002.

N. Azizi, et al.: "Low Leakage Asymmetric-Cell SRAM", IEE TVLSI, vol. 11, Issue 4, pp. 701-715, Aug. 2003.

K. Flaunter et al.: "Drowsy Caches: Simple Techniques for Reducing Leakage Power", ISCAS, Arizona, USA, May 2002.

L. Mathew et al.: "CMOS Vertical Multiple Independent Gate Field Effect Transistor (MIGFET)", IEEE SOI, Conference, Oct. 2004.

K. Takeda et al.: "A 16-Mb 400-MHz Loadless CMOS Four-Transistor SRAM Macro", IEEE, JSSC, vol. 35, No. 11, Nov. 2000.

K. Osada et al.: "16.7-fA/Cell Tunnel-Leakage-Suppressed 16-Mb SRAM for Handling Cosmic-Ray-Induced Multierros", IEEE JSSC, vol. 38, No. 11, Nov. 2003.

E. Seevinck, et al.: "Static-Noise Margin Analysis of MOS SRAM cells", IEEE JSSC, vol. SC-22, No. 5, Oct. 1987.

M. Vinet at al.: "Planar Double Gate CMOS Transistors with 40nm Metal Gate for Multipurpose Applications", SSDM, 2004.

Christ H. Kim, et al.: "PVT-Aware Leakage Reduction for On-Die Caches with Improved Read Stability", IEEE International Solid-State Circuits Conference, 2005, Session 26, Static Memory.

Kedzierski, et al.: "High-Performance Symmetric-Gate and CMOS-Compatible Vt Asymmetric-Gate FinFET Devices", 2001, International Elecgtron Devices Meeting, pp. 437-440.

G. Ilicali, et al.: Planar Double Gate Transistors with Asymmetric Independent Gates,: International SOI conference, 2005, pp. 126-127.

C.-H. Lu, et al.: Characteristics and Mechanism of Tunable Work Function Gate Electrodes Using a Bilayer Metal Structure on SiO2 and HfO2, EDL, vol. 26(7), 2005, pp. 445-447.

L. Matthew et al.: "Multiple Independent Gate Field Effect Transistor (MIGFET)-Multi-Fin RF Mixer Architecture, Three Independent Gates (MIGFET-T), Operation and Temperature Characteristics", Symposium on VLSI Technology Digest of Technical Papers, 2005.

O. Thomas: "An SOI 4 Transistors Self-Refresh Ultra-Low Voltage Memory Cell", ISCAS, Thailand, Bangkok, May 2003.

French Preliminary Search Report, FA 689387, FR 0656014, dated Jul. 18, 2007.

* cited by examiner

MEMORY CELL PROVIDED WITH DUAL-GATE TRANSISTORS, WITH INDEPENDENT ASYMMETRIC GATES

CROSS REFERENCE TO RELATED APPLICATIONS OR PRIORITY CLAIM

This application claims priority to French Patent Application No. 06 56014, filed Dec. 28, 2006.

TECHNICAL FIELD

The invention relates to the field of memories, in particular to that of static random access memories SRAMs (RAM standing for "random access memory"). The invention concerns an improved memory cell structure, provided with dual gate transistors and comprising transistors with asymmetric dual gates and transistors with symmetrical dual gates.

PRIOR ART

A conventional SRAM memory cell (SRAM standing for "static random access memory" or static RAM memory) generally comprises two inverter gates 10, 11 connected to storage modes T and F in a so-called "flip-flop" configuration and two access transistors 12, 13 connected to so-called bit lines 15 and 16, and controlled by a word line 17 (FIG. 1).

The characteristics sought for a memory cell are:
good stability during various reading, writing and retention operations performed on the cell,
a conduction or charging current as high as possible in order to give the cell a high operating rate,
a cell size as small as possible in order to produce a memory with a high cell integration density,
a retention current as low as possible in order to minimize the static consumed power.

These criteria are contradictory with each other and lead the designers of memories to make compromises.

SRAM cells with six transistors, known as "6T" cells, offer a good compromise between all the aforementioned criteria. SRAM memory cells known as "4T", with four transistors, have also been developed. 4T cells have reduced size and make it possible to obtain a high integration density.

However, by seeking to reduce the sizes of the transistors in memory cells more and more, the parameters of these transistors, such as their channel width W, their channel length L, their threshold voltage $V_T$, their permeability $\mu_0$, their doping Na and their gate oxide thickness Tox, fluctuate. This, as indicated in the documents [TAK01] and [YAM04] (referenced at the end of the present description in the same way as all the other documents cited in the present application), gives rise to an increase in the sensitivity of the memory cells in the face of various sources of noise such as capacitive coupling, inductive coupling and supply noise. The development of a memory cell having a high noise margin is therefore becoming more and more of a priority.

For conventional 6T memory cells, the stability of the cells is determined by their static noise margin (SNM) in read mode. This is because, when accessing in read mode, the gain of the inverter gates of the cell has a tendency to be reduced by the access transistors being made conductive.

To cancel out this effect, a 10-transistor cell for which, during a read cycle, the storage nodes and bit lines are decoupled, was proposed in the document [CHA01].

An 8-transistor memory cell implemented in dual-gate technology having functioning similar to the one comprising 10 transistors mentioned previously, for its part was disclosed in the document [KIM05]. Despite a great improvement in the static noise margin SNM, the 10-transistor and 8-transistor cells are very bulky compared with 6T cells.

As for 4T cells these have the drawback of having a lack of stability in retention mode. This lack of stability can be mitigated by a refresh system. The documents [CEA03], [YAM04], [MOS02] and [TI02] have various 4T cell devices with no refresh system.

These cells are limited to implementation in a given technology and require specific operating modes, for example an operating mode with a supply voltage less than 0.5 V and/or temperature regulation.

Typically, in sizing 4T cells, account is taken of the best compromise that can be achieved between stability in retention phase and stability in read phase. Several solutions have been presented for improving the ratio of these stabilities.

The document [TI02] presents for example a static random access memory microelectronic device provided with 4T cells implemented on a solid substrate, commonly referred to as "bulk" (according to English terminology), in which the voltage of the word line is reduced, in order to increase the static noise margin. The 4T cells disclosed in this document do however have a low conduction current.

In the document [MOS02], means for controlling the potential of the substrate of the load transistors are provided in order to improve the retention stability of the cell. This solution can also make it possible to use a cell with transistors of very small size, for example, having a channel length of around 0.18 μm. However, the use of these control means is constraining.

In the document [CEA03], the design of a cell called "4T-SR" in partially depleted SOI technology (SOI standing for "silicon on insulator") is presented. This cell is characterized by an autoregulation of the charges of the storage nodes and makes it possible to keep information stored without having recourse to a refresh circuit. One drawback of this cell is that it is specific to partially depleted SOI technology (SOI standing for "silicon on insulator") and requires a supply voltage of less than 0.5 V.

A 4T cell implemented in fully depleted (FD) SOI technology provided with a feedback loop was for its part disclosed in the document [YAM04]. This loop makes it possible to control the active substrate of the transistors in order to modulate their threshold voltage dynamically.

The problem is posed of finding a novel SRAM memory cell structure, having on the one hand improved stability and static noise margin whilst keeping a satisfactory and possibly improved size.

The problem is posed of finding a novel SRAM memory cell structure in dual-gate technology, having good retention, read and write stability, whilst keeping a satisfactory and possibly improved size.

DISCLOSURE OF THE INVENTION

The invention concerns first of all a random access memory cell comprising:
at least a first plurality of symmetrical dual-gate transistors forming a flip-flop,
at least a first dual-gate access transistor and at least a second dual-gate access transistor disposed respectively between a first bit line and a first storage node, and between a second bit line and a second storage node, a first gate of the first access transistor and a first gate of the second access transistor being connected to a first word line able to route a biasing signal, a second gate of the first access transistor being connected to the second storage node and a second gate of the second access transistor being connected to the first storage node, the first access transistor and the second access transistor being provided with an asymmetric dual gate.

A memory cell structure of this type comprises both symmetrical dual-gate transistors and asymmetric dual-gate transistors.

The use of symmetrical dual-gate transistors to form the flip-flop limits leakage currents and limits consumption.

The use of asymmetric dual-gate transistors to form the access transistors modulates the leakage and conduction currents in order to increase the read and retention stability.

Such a cell has improved stability and static noise margin, as well as reduced size compared with a 6T cell according to the prior art.

According to one possibility of implementation, said first plurality of transistors may be formed by:

a first symmetrical dual-gate load transistor and a second symmetrical dual-gate load transistor, the two gates of the first load transistor being connected together, and the two gates of the second load transistor also being connected together, or a first symmetrical dual-gate conduction transistor and a second symmetrical dual-gate conduction transistor, the two gates of the first conduction transistor being connected together, the two gates of the second conduction transistor also being connected together.

One embodiment of the invention provides for a memory cell provided with four transistors.

According to another embodiment, the random access memory cell may also comprise:

at least a second word line,
at least third and fourth bit lines,
at least third and fourth dual-gate access transistors, connected respectively to the third bit line and to the fourth bit line.
the third access transistor and the fourth access transistor may be provided with an asymmetric dual-gate transistor.

According to the other embodiment, the cell may be arranged so that a first gate of the third access transistor and a first gate of the fourth access transistor are connected to the second word line able to route a biasing signal, a second gate of the third access transistor being connected to the second storage node and a second gate of the fourth access transistor being connected to the first storage node.

A memory cell provided with six transistors and arranged according to this other mode may also be provided.

According to one possibility of implementation, the random access memory cell, in which the two gates of the third access transistor and/or of the fourth access transistor are connected to the second word line, the cell may also comprise:

at least one supplementary dual-gate transistor between the third access transistor and the first node, the two gates of the supplementary transistor being connected to each other,
at least one other supplementary dual-gate transistor between the fourth access transistor and the second node, the two gates of the supplementary transistor being connected to each other.

The supplementary transistors may each be provided with a symmetrical dual gate.

According to a first possibility, said asymmetric dual gates may be of the "planar" type formed by at least a first gate block and at least a second gate block on each side of an active semiconductor zone, the first gate block, the active semiconductor zone and the second gate block being superimposed on a substrate.

According to a second possibility, the transistors of the memory may be of the finFET type, said asymmetric dual gates being formed by at least a first gate block and at least a second gate block on each side of an active semiconductor zone, the first active semiconductor zone gate block and the second gate block being juxtaposed on a substrate.

The asymmetry may also be of a type such that said first gate block has a given critical dimension, said second gate block having a critical dimension different from said given critical dimension.

The asymmetry may also be of a type such that the first gate block is separated from the semiconductor active zone by a first block of dielectric material of given thickness, the second gate block being separated from the semiconductor active zone by a second block of dielectric material with a thickness greater than the given thickness.

The asymmetry may also by of a type such that the first gate block is separated from the semiconductor active zone by a first block of dielectric material of given thickness, the second gate block being separated from the semiconductor active zone by a second block of dielectric material with a thickness greater than the given thickness.

The asymmetry may also be of a type such that said asymmetric dual gates are formed respectively from a first gate block of given composition and a second gate block with a composition different from the given composition. By different composition it is understood to be formed from different materials and/or stacks of different materials and/or doped differently.

Said asymmetric dual gates may possibly be formed with several of the types of asymmetry mentioned previously.

Said second block may belong to said second gate of said transistors, while said first block belongs to said first gate of said transistors.

For each of the first and second access transistors, the gate that is connected to the storage nodes may be that of the two gates that has the smallest critical dimension.

The invention also concerns a memory comprising a plurality of cells as defined previously.

The invention also concerns a microelectronic memory device comprising an SRAM memory as defined previously.

BRIEF DESCRIPTION OF THE DRAWINGS

The present invention will be better understood from a reading of the description of example embodiments given purely for indication and in no way limitatively, referring to the accompanying drawings, in which.

Identical, similar or equivalent parts of the various figures bear the same numerical references so as to facilitate moving from one figure to another.

The various parts depicted in the figures are not necessarily shown to a uniform scale, in order to make the figures more legible.

DETAILED DISCLOSURE OF PARTICULAR EMBODIMENTS

An example of a microelectronic device according to the invention, comprising at least one random access memory cell structure, will now be described.

The cell may be of the SRAM (SRAM standing for Static Random Access Memory) and is provided with dual-gate transistors, which may for example be implemented in CMOS technology (CMOS standing for "Complementary Metal Oxide Semiconductor"). By dual-gate transistors it is understood that these transistors comprise independent first and second gates formed on each side of an active zone, the first gate and the second gate being connected to each other or not.

The transistors of the cell may have a dual gate with a so-called "planar" structure, formed from a first gate and a second gate, arranged so that the first gate, a semiconductor active zone intended to form one or more channels, and the second gate, are superimposed on a support.

Figure 1:
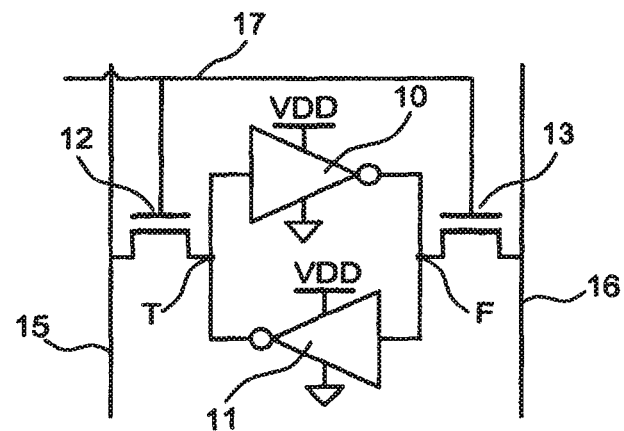
FIG. 1 illustrates an example of a static random access memory cell according to the prior art.
Figure 2A:
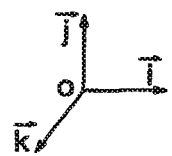
FIGS. 2A and 2B illustrate respectively an example of a dual-gate transistor of the "planar" type and another example of a dual-gate transistor of the "FinFET" type, FIG. 3 gives the change in the channel current of an example of a dual-gate transistor, as a function of the biasing of its two gates, FIG. 4 gives the change in the channel current of an example of an asymmetric dual-gate transistor as a function of the biasing of its two gates.
Figure 2A:
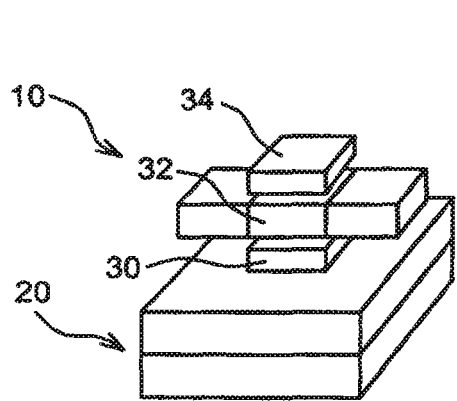

In FIG. 2A, an example of a transistor 10 formed on a substrate 20 and provided with a planar dual gate is given. The dual gate comprises at least a first block 30 based on at least one gate material and situated under an active zone 32, and at least a second block 34 based on at least one gate material and situated above said active zone 32, the first block 30, the active zone 32 and the second block 34 being superimposed on the substrate 20 or situated in distinct planes respectively parallel to the principle plane of the substrate 20 (the principal plane of the substrate being defined on this figure as a plane passing through the substrate and parallel to the plane [O; $\vec{i}$; $\vec{k}$] of an orthogonal reference frame [O; $\vec{i}$; $\vec{j}$; $\vec{k}$]).

According to a variant, the transistors of the memory cell may be dual-gate transistors and of the so-called finFET type. In this type of transistor, the dual gate is formed by a first gate and a second gate, arranged so that the first gate, a semiconductor active zone intended to form one or more channels, and the second gate, are juxtaposed on a support.

Figure 2B:
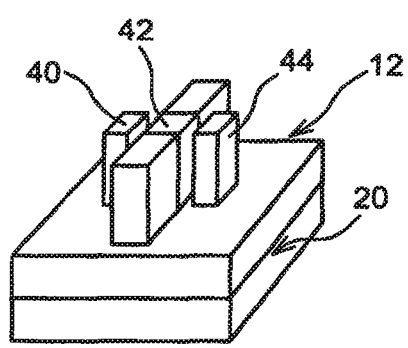

In FIG. 2B, an example of a transistor 12 of the "finFET" type formed on a substrate 20 and provided with a dual gate is given. The dual gate comprises at least a first block 40 based on at least one gate material and at least a second block 44 based on at least one gate material, disposed on each side of an active zone 42, the active zones and the blocks 40, 44 of the dual gate resting on the substrate 20 and being situated in the same plane parallel to the principle plane of the substrate 20.

Figure 3:
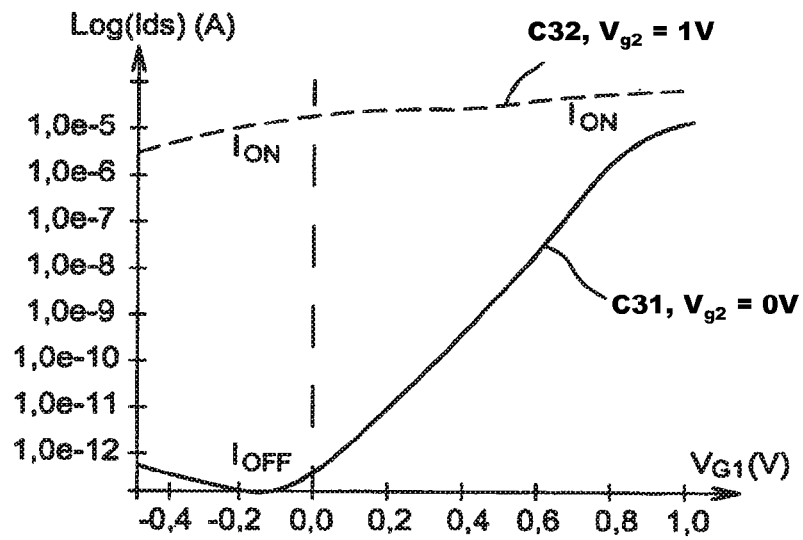

Electrical characteristics of a symmetrical dual-gate transistor are illustrated in FIG. 3, in which two biasing curves C31 and C32 are given. In this figure, a first biasing curve C31 represents the change in the drain-source current Ids (plotted in amps (A) as Log(Ids)) as a function of a potential Vg1 applied to a first gate of the transistor, when the second gate of the transistor is in a first biasing state and a given potential Vg2, for example of 0 volts, is applied to the second gate. A second biasing curve C32 represents the change in the drain-source current Ids as a function of a potential Vg1 applied to the first gate of the transistor, when the second gate of the transistor is in a third biasing state and another given potential Vg2, for example 1 volt, is applied to the second gate. $I_{ON}$ and $I_{OFF}$ indicate portions on the curves in which the transistors are considered conducting and non-conducting, respectively.

The random access memory cell according to the invention is provided with asymmetric dual-gate transistors. The memory cell can in particular be provided with access transistors, the dual gate of which is asymmetric.

An asymmetric dual gate is formed by two distinct gates asymmetric with respect to the principal plane of the semiconductor active zone on each side of which these gates are disposed. In a transistor provided with an asymmetric dual gate, the current delivered between the drain and the source of the transistor is different depending on whether the first gate or the second gate is activated, even for an identical biasing.

Figure 4:
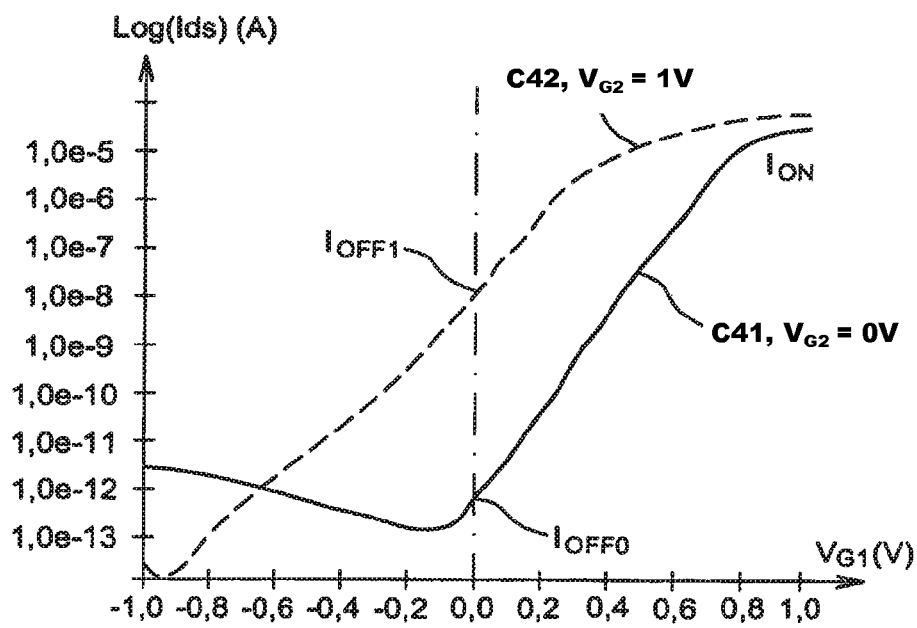

FIG. 4 gives electrical characteristics of an example of an asymmetric dual-gate transistor able to be integrated in a memory cell according to the invention. In this figure, curves $C_{41}$, $C_{42}$ represent the change in the current passing through the active zone of the transistor, between its drain and its source, as a function of a potential $V_{G1}$ applied to its first gate for various fixed values of a potential $V_{G2}$ applied to its second gate. The curve $C_{41}$ is given for a first potential value $V_{G2}$ which, in this example, is 0 volts, while the curve $C_{42}$ is given for a second potential value $V_{G2}$ which, in this example, is 1 volt. This example of a transistor is characterized by two currents $I_{ON}$ in the conducting state for a potential applied to the first gate $V_{G1}$=VDD and a potential applied to the second gate $V_{G1}$ such that $V_{G1}$=$V_{G2}$=VDD and two currents $I_{OFF}$ in the off state for $V_{G1}$=0V depending on whether $V_{G2}$=0V or VDD. $I_{OFF0}$ and $I_{OFF1}$ are first and second non-conducting portions in the transistor characteristic.

Figure 5A:
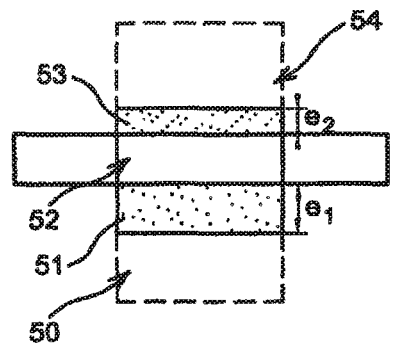
FIGS. 5A-5C illustrate various embodiments of an asymmetric planar dual-gate of a transistor able to be integrated in a memory cell according to the invention.
Figure 5B:
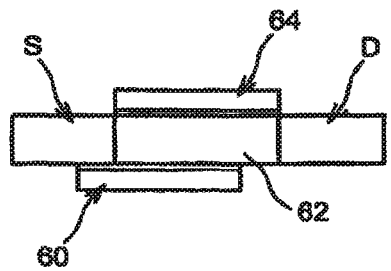
Figure 5C:
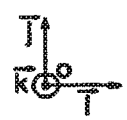
Figure 5C:
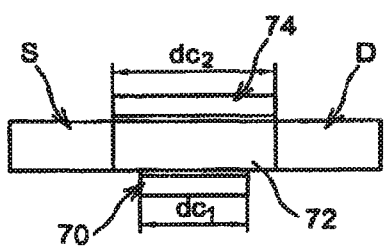

FIGS. 5A to 5C give various examples of asymmetries that an asymmetric planar dual-gate structure of a transistor integrated in a memory cell according to the invention is able to comprise.

The asymmetry of the dual gate can be obtained in particular by forming two layers of gate dielectrics of different thicknesses.

FIG. 5A, illustrates an example of a structure of an asymmetric planar dual-gate transistor provided with a first gate 50 or bottom gate, in contact with a first gate dielectric layer 51 of thickness $e_1$, and a second gate 54 formed on a second gate dielectric layer of thickness $e_2$ less than $e_1$. The two gates 50 and 54 are thus placed at different respective distances from the semiconductor active zone 52 situated between the drain and source of the transistor.

Another example of asymmetry is illustrated in FIG. 5B. In this figure, an asymmetric planar dual-gate transistor is provided with a first gate 60 formed below and opposite a semiconductor active zone 62 situated between the source region S and the drain region D of the transistor, and a second gate 64 formed above and opposite a part of said semiconductor active zone 62 and part of the source region S. The two gates 60, 64 are not symmetrical with respect to a normal to the principal plane of the active zone 52 (the principal plane of the active zone being defined in this figure as a plane passing through the active zone and parallel to the plane $[O, \vec{i}, \vec{k}]$ of an orthogonal reference frame $[O, \vec{i}, \vec{j}, \vec{k}]$). i The asymmetry can also be obtained in particular by forming two gates with different critical dimensions.

FIG. 5C illustrates an example of a structure of an asymmetric planar dual-gate transistor provided with a first gate 70 or bottom gate, with a critical dimension $dc_1$, and a second gate 74 or top gate, with a critical dimension $dc_2$ greater than $dc_1$. A semiconductor active zone is disposed between gates 70 and 74, and a source S and drain D are provided on either side of the semi-active zone.

A dual gate combining several aforementioned types of asymmetries can also be used, for example having two gates with different critical dimensions.

A detailed example of a method of producing an asymmetric planar dual-gate structure formed by two gates with different critical measurements or dimensions will now be given in relation to FIGS. 6A to 6C.

Figure 6A:
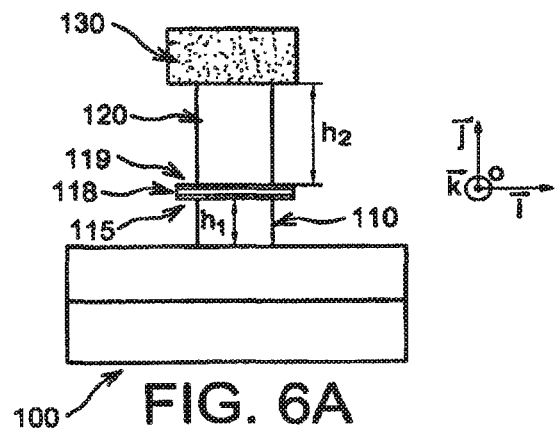
FIGS. 6A-6C illustrate an example of a method of producing an asymmetric planar dual-gate.

First of all, on a support 100, a structure formed by a stack as illustrated in FIG. 6A is produced, comprising a first gate block 110, a first gate dielectric zone 115 resting on the first block 110, a semiconductor zone 118 resting on the first dielectric zone 115, a second gate dielectric zone 119 resting on the semiconductor zone 118, a second gate block 120 resting on the second dielectric zone 119. The second gate block 120 can be produced with a height $h_2$ great than the height $h_1$ of the first gate block (the heights $h_1$ and $h_2$ being dimensions defined in a direction parallel to the vector $\vec{j}$ of an orthogonal reference frame $[O; \vec{i}; \vec{j}; \vec{k}]$ in FIG. 6A). The second gate block 120 can also be surmounted by a hard mask 130 based on dielectric material. The dielectric zones 115 and 119 and the semiconductor zone 118 have a critical measurement or dimension greater than that of the first gate block 110 and of the second gate block 120 (the critical dimensions being dimensions defined in the direction parallel to the vector $\vec{i}$ of the orthogonal reference frame $[O; \vec{i}; \vec{j}; \vec{k}]$ in FIG. 6A). The hard mask 130 can also have a critical measurement or dimension greater than that of the first block 110 and second block 120. The second gate block 120 can be formed for example from a layer based on polysilicon. The first gate block 110 can also be formed for example from a layer based on polysilicon. To produce the first block 110 and second block 120 an etching, for example anisotropic, may have been carried out on a stack of thin layers through a hard mask, so as to form the first gate block, the first dielectric zone, the semiconductor zone, the second dielectric zone and the second gate block. A second isotropic etching may then have been carried out, selective vis-à-vis the semiconductor zone 118 and the dielectric zones 115 and 119, so as to reduce laterally the first gate block and the second gate block.

Figure 6B:
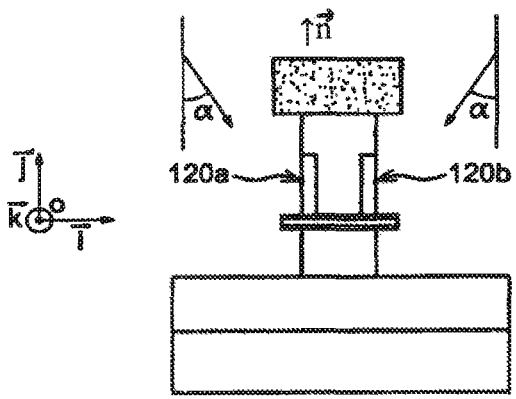
Figure 6C:
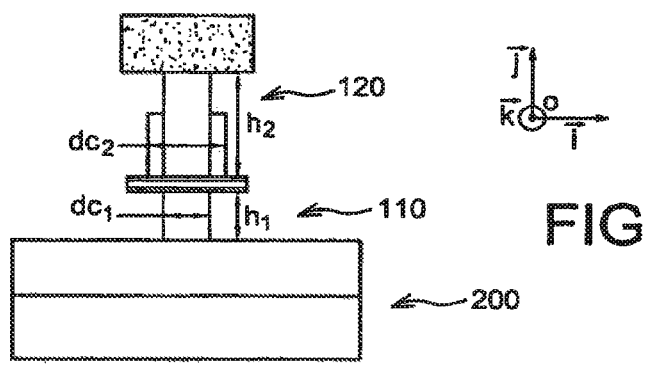

After having obtained this structure, an inclined ion implantation is carried out (FIG. 6B) at a predetermined angle α with respect to a normal to the principal plane of the support 100 (the principal plane of the support being defined in FIG. 6B as a plane passing through the support and parallel to the plane $[O; \vec{i}; \vec{k}]$). $\uparrow \vec{n}$ designates the normal to the principal plane of the support 100.

The critical dimensions of the dielectric zones 115, 119, the respective heights $h_1$ and h2 of the first gate block 110 and second gate block 120 and the implantation angle α are designed to achieve a doping of the second gate block, preferably without doping or doping less than the first block 110. A doping of the zones 120a, 120b situated level with the sides of the second block is preferably carried out without doping the first block 110 or doping the first block 110 less or preferably without doping the first block 110 in the zone of the latter situated in contact with the gate dielectric zone 115.

The implanted zones 120a, 120b of the second block 120 are preferably in contact with the second dielectric zone 119. The implantation can be carried out at a dose and energy chosen according to the difference in final critical dimensions desired between the first block and second block. The implantation may for example be an arsenic implantation at a dose of 3e15 atoms.cm-2 and an energy sized according to the required critical dimension difference. According to a variant the implantation can be carried out with germanium.

Next a selective etching is carried out vis-à-vis the implanted parts of the second block. After this etching, the second block 120 has a critical dimension $dc_2$ greater than the critical dimension $dc_1$ of the first block 110 (FIG. 6C). In the case where the first block 110 and second block 120 are based on polysilicon, the etching could be a wet chemical etching used in order to obtain a selectivity of etching of the doped polysilicon with respect to the polysilicon, for example using TMAH (Tetra-Methyl Ammonium Hydroxide). In the case where the first block and second block are based on polysilicon, the implantation carried out previously may be an implantation of germanium in the polysilicon, so as then to use a selective etching method for example based on $CF_4$ of the polysilicon implanted with germanium, with respect to the polysilicon.

According to a variant of the method that had just been described, the blocks 110 and 120 may be formed by a stack of a semiconductor layer, for example based on polysilicon, and a metal layer, for example based on TiN.

The method described above can be implemented in order to produce or co-integrate, on the same support or the same substrate 100, asymmetric planar dual-gate transistors and symmetrical planar transistors.

Figure 7A:
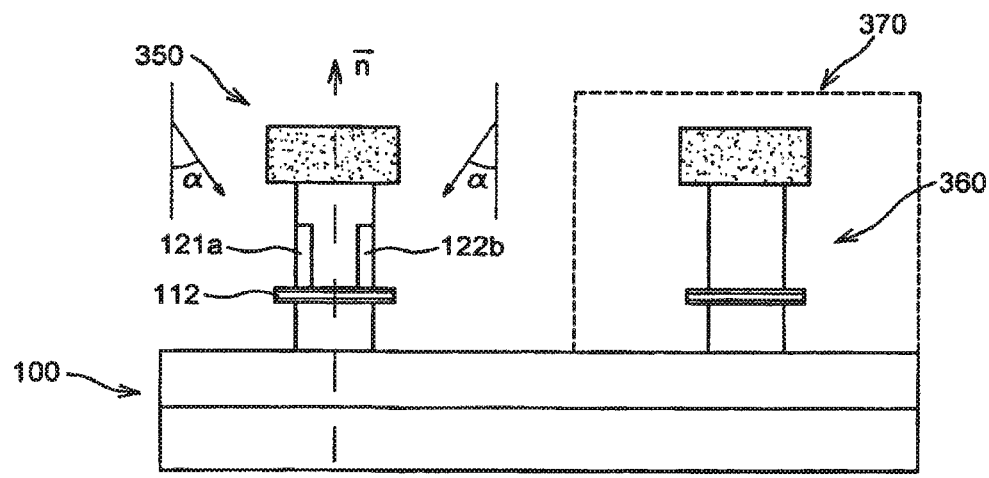
FIGS. 7A-7B illustrate an example of a method of producing an asymmetric dual-gate structure and a symmetrical dual-gate structure on the same substrate.

For this purpose, several structures are produced on a substrate such as the substrate 100, for example a first structure 350, and a second structure 360 of the same type as the structure described above. Next, prior to the selective implantation step, protection means vis-à-vis an ion implantation beam are formed for at least one particular structure among the structures 350, 360 produced on the substrate 100, for example for the second structure 360. These protection means can be formed from at least one layer 370 defined for example by photolithography and covering the second structure 360. The protective layer 370 reveals at least one other structure 350 and can for for example be a resin-based layer or a hard mask, for example based on $Si_3N_4$ or $SiO_2$ (FIG. 7A). $\vec{n}$ designates the normal to the principal plane of the support 100.

Next a selective implantation of the second gate block of the first structure 350 is carried out, for example as described above in relation to FIG. 6B. During this implantation, the layer 370 protects the second structure 360 of the cluster of particles. Next the protective layer 370 is removed.

Figure 7B:
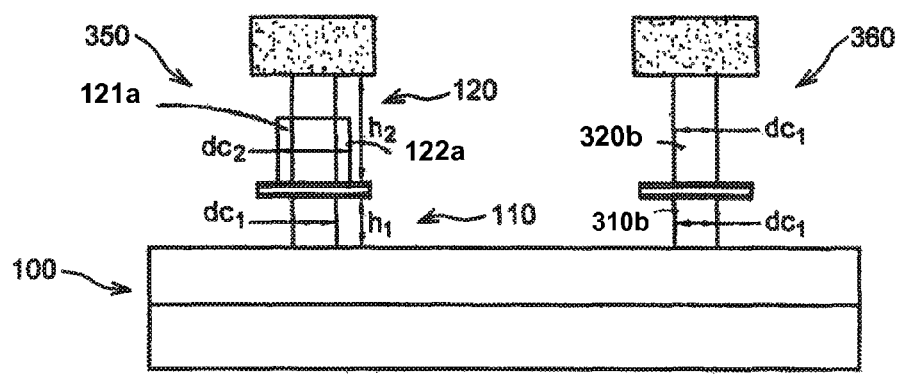

Then the step of etching the gate blocks of the first structure 350 and second structure 360 is carried out. This etching is a selective etching of the implanted semiconductor zones vis-à-vis semiconductor zones that have not been implanted (for example, semiconductor zone 112 in FIG. 7A). In FIG. 7B, the first structure 350 and second structure 360 resting on the substrate 100 are shown, once the etching has been carried out. The first structure 350 comprises a first gate block 110a of critical dimension $dc_1$ and a second block 120a intended to form a second gate of critical dimension $dc_2$, the implanted semiconductor zones 121a, 122a having been less etched than the non-implanted semiconductor zones. The second structure 360, once the selective etching has been carried out, comprises a first block 310a intended to form a first gate, and has a critical dimension $dc_1$, while the second block 320b intended to form a second gate has a critical dimension $dc_1$, identical to that of the first block. The first structure 350 is designed for an asymmetric dual-gate transistor while the second structure 360, carried out on the first substrate 100 as the first, is designed for a symmetrical dual-gate transistor.

Figure 8:
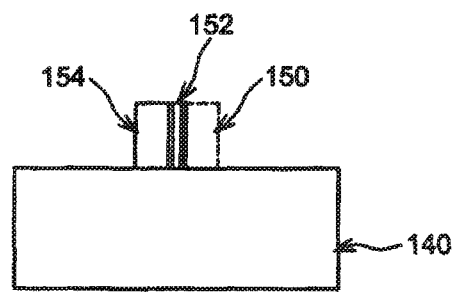
FIG. 8 illustrates an asymmetric dual gate of a transistor of the finFET type able to be integrated in a memory cell according to the invention.

In FIG. 8, an example of an asymmetric dual-gate structure of a transistor of the finFET type, able to be integrated in a memory cell according to the invention, is given. In this example, a first gate 150 and a second gate 154 rest on a substrate 140 on each side of a semiconductor active zone 152, and are disposed against the sides of this zone 152. The asymmetry of the dual gate may be geometric asymmetry with respect to the active zone and/or a composition asymmetry between the two gates 152 and 154. By composition asymmetry it is understood that the two gates are based on different materials, and/or are formed from different stacks of materials and/or are doped differently.

Figure 9A:
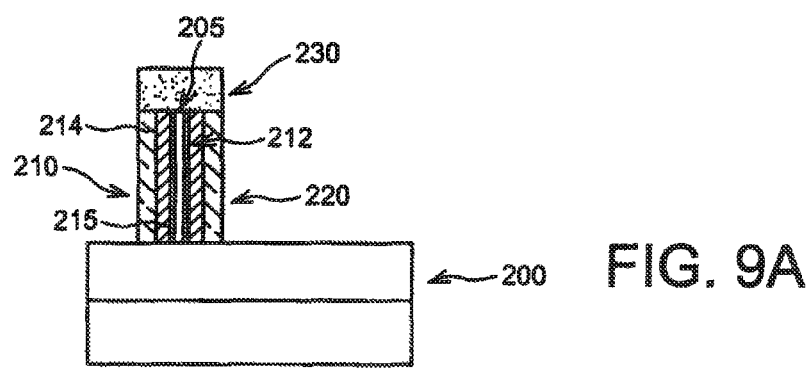
FIGS. 9A-9C illustrate an example of a method of producing an asymmetric dual gate for a transistor of the finFET type.
Figure 9B:
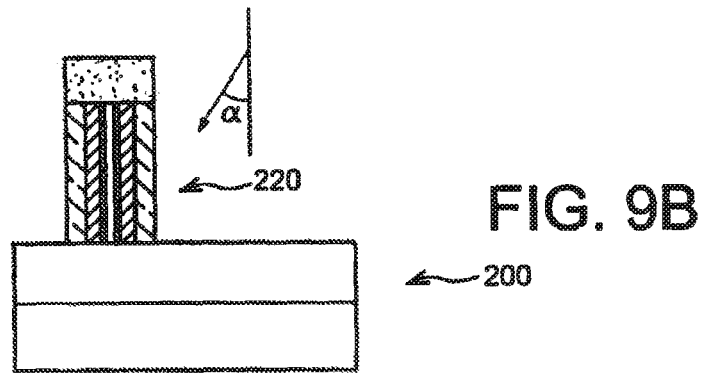
Figure 9C:
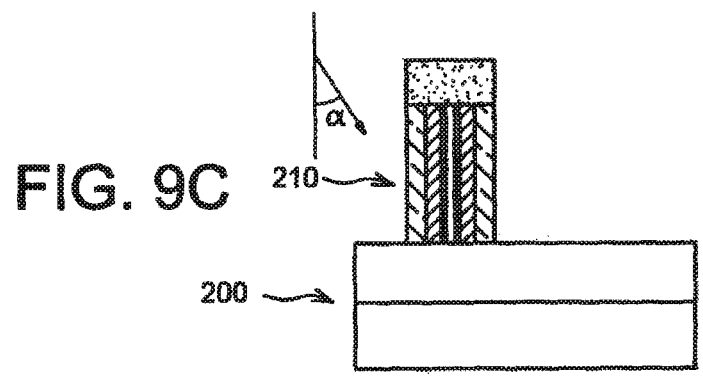

An example embodiment of an asymmetric dual gate for a finFET transistor, formed from two gates doped differently from each other, is given in relation to FIGS. 9A-9C.

In this example, a dual-gate structure is first of all produced, comprising two gates, 210, 220, on each side of a semiconductor zone 205, using a hard mask 230 as described in FIG. 6A for example. The first gate 210 and the second gate 220 are each formed from a dual layer comprising a metal bottom layer 212, in contact with a gate dielectric layer 215, and a second semiconductor top layer 214, in contact with the first metal layer 212. The gate dielectric layer may for example be based on $SiO_2$ or $HfO_2$ and have a thickness of between for example 1 and 5 nanometres. The metal layer 212 may for example be based on TiN and have a thickness of for example between 1 and 5 nanometres. The semiconductor layer 214 may for example be based on polysilicon and have a thickness of between for example 1 and 50 nanometres (FIG. 9A).

Once this structure is formed, a first inclined implantation is carried out on the first gate 210 situated on one side of the semiconductor zone 205, so as to carry out a doping of a first type, for example N type, of the semiconductor top layer 214 of the first gate 210 (FIG. 9B).

Then another inclined implantation is carried out on the second gate 220 situated on the other side of the semiconductor zone 205, so as to carry out a doping of a second type, for example P type, of the semiconductor top layer 214 of the second gate 220 (FIG. 9C).

The asymmetry may also be obtained by different thicknesses of the metal layer 212 on each side of the semiconductor zone. According to the thickness of the bottom layer 212, the work function of each gate varies between a work function close to that of the top layer when the bottom layer is very thin, and that of the bottom layer when the latter exceeds several tens of nanometres. The work function of the gate formed from the dual layer, for example TiN/N doped polysilicon, varies with the thickness of the TiN metal layer. When the layer of TiN is very thin, for example 5 nm, the threshold voltage Vth of the NMOS may for example be around 0.2 V, which is equivalent to a work function of the dual layer of around 4.7 eV whereas, when the thickness of TiN is 10 nm, the threshold voltage goes to 0.4 V, that is to say a work function of approximately 4.5 eV. The N doped polysilicon has an work function of approximately 5.1 eV. When the bottom layer is very thin, the work function of the dual layer can be moved towards that of the top layer even when the latter is made from polysilicon.

Figure 10:
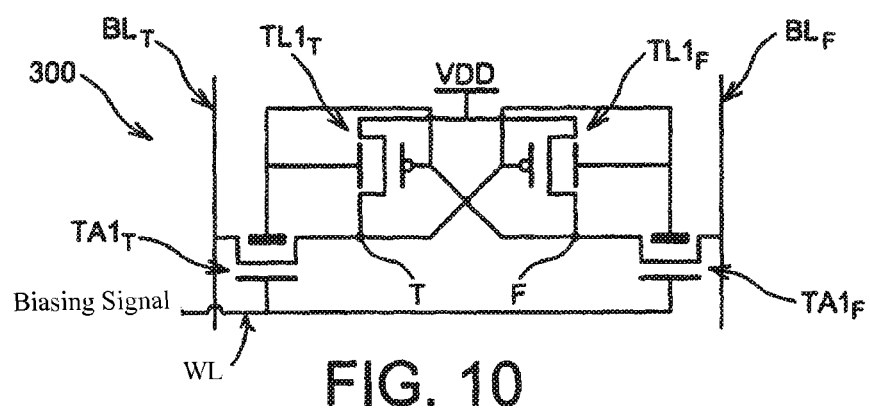
FIG. 10 illustrates an example of a 4T memory cell according to the invention provided with four dual-gate transistors, including two asymmetric dual-gate access transistors.

A first example of a random access memory cell 300 according to the invention is illustrated in FIG. 10.

This memory cell 300 is an SRAM static memory cell of the 4T type, provided with four dual-gate transistors, for example implemented in MOS technology. The cell 300 comprises a first plurality of transistors forming a first inverter gate and a second inverter gate, connected in a flip-flop configuration, or commonly referred to as "flip-flop". The first plurality of transistors can be formed from a first load transistor $TL1_T$ and a second load transistor $TL1_F$. The load transistors $TL1_T$ and $TL1_F$ may be produced in a first given type of MOS type technology, for example a technology of the PMOS type. The two gates of the first load transistor $TL1_T$ are connected to each other while the two gates of the second load transistor $TL1_F$ are also connected together. The dual gate of the second load transistor $TL1_F$ is also connected to a first storage node T of the first cell 300, while the dual gate of the first load transistor $TL1_T$ is also connected to a second storage node F of the first cell 300. The sources of the load transistors $TL1_T$, $TL1_F$, for their part can be connected together and to a supply potential VDD, while the drain of the first load transistor $TL1_T$ can be connected to the first node T and the drain of the second load transistor $TL1_F$ is connected to the second node F. The load transistors $TL1_T$ and $TL1_F$ are designed to maintain a charge necessary for the establishment of a given logic level, for example a '1' level, corresponding for example to a potential equal to the supply potential VDD, on one or other of the nodes T or F, according to the logic value stored in the cell 300. The load transistors $TL1_T$ and $TL1_F$ can be provided with a symmetrical dual gate.

The first cell 300 is also provided with a first asymmetric dual-gate access transistor $TA1_T$ and a second asymmetric dual-gate access transistor $TA1_F$. The access transistors $TA1_T$, $TA1_F$ can for example be of the NMOS type. The first access transistor $TA1_T$ and the second access transistor $TA1_F$ each comprise a first gate connected to a first word line WL. The second gate of the first access transistor $TA1_T$ is connected to the second storage node F, while the second gate of the second access transistor $TA1_F$ is connected to the first storage node T. The source of the first access transistor $TA1_T$ is connected to a first bit line $BL_T$, while the source of the second access transistor $TA1_F$ is connected to a second bit line $BL_F$. The drain of the first access transistor $TA1_T$ for its part is connected to the first storage node T while the drain of the second access transistor $TA1_F$ is connected to the second storage node F. The access transistors $TA1_T$, $TA1_F$ are arranged so as to allow access to the storage nodes T and F during a phase of reading or writing to the cell 300, and to block access to the cell 300 when the cell 300 is in an information retention mode.

Such a cell 300 makes it possible to obtain an improved static noise margin as well as an improved compromise between retention stability and read stability. In this example, keeping the information stored in retention without having recourse to refresh means is also achieved. The word line WL is controlled according to the mode in which it is wished to place the cell 300.

An example of the functioning of such a cell 300 is as follows:

In retention mode, the bit lines $BL_T$, $BL_F$ are connected to a potential VSS while the word line WL is also maintained at the potential VSS in order to stabilize a stored data item. The access transistors $TA1_T$ and $TA1_F$ for their part are in an off state. In the case where the first node T is at a logic high level and the second node F at a logic low level, the second load transistor $TL1_F$ is also off, only the first load transistor $TL1_T$ being on. To keep the potential of the second node F close to VSS, the current passing through the second access transistor $TA1_F$ must be greater than the sum of the current passing through the second load transistor $TL1_F$ and the gate current issuing from the first load transistor $TL1_T$. The connection of the second gate of the second access transistor $TA1_F$ to the first storage node T, set to VDD, makes it possible to increase its leakage current for example by 2 to 3 decades and thus guarantee good retention stability. The use of transistors with an asymmetric dual-gate architecture makes it possible to achieve this condition since, because of the polarization conditions, the second access transistor $TA1_F$ has a threshold voltage lower than that of the second load transistor $TL1_F$.

In read mode, the bit lines are initially charged or pre-charged to a potential VSS. Next the word line is biased to a potential VDD designed so as to allow access to the storage nodes T, F. The stability of the cell 300 in read mode depends on the relationship between the conduction currents of the transistors $TL1_T$ and $TA1_T$. In order to obtain to obtain a maximum noise margin, the conduction current passing through the first access transistor $TA1_T$ is designed to be less than the conduction current of the first load transistor $TL1_T$. The connection of the second gate of the first access transistor $TA1_T$ to the storage node F, of zero voltage, makes it possible to limit the current in the on state of the first access transistor $TA1_T$ and thus to guarantee good stability of the cell 300 in read mode. The use of dual-gate architecture transistors makes it possible to achieve this condition since, having regard to the polarization conditions in read mode, the first access transistor $TA1_T$ will be provided with one channel, while the first load transistor $TL1_T$ will be provided with two channels.

In read mode, in order to write for example a logic '0' value on the first node T so that T=0 and F=1, the second bit line $BL_F$ is initially charged or pre-charged to a potential VDD while the first bit line BLT is maintained at a potential VSS. Next the word line WL is biased to the potential VDD in order to active the access transistors $TA1_T$ and $TA1_F$ so as to connect the storage nodes to the bit lines.

Figure 11:
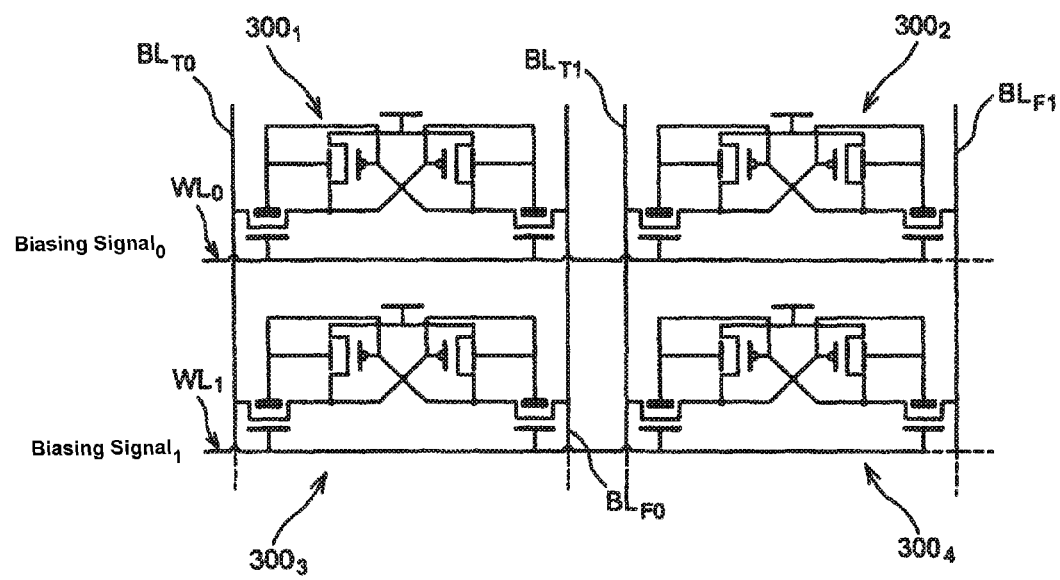
FIG. 11 depicts a portion of a memory matrix provided with 4T cells of the same type as in FIG. 9.

The memory cell 300 that has just been described can be integrated in a memory matrix, as illustrated in FIG. 11. In this figure, four cells $300_1$, $300_2$, $300_3$, $300_4$, among n cells (with n>0) of the same type as in the cell 300, of a memory matrix are shown. The memory matrix is formed from p columns, each column comprising m cells of the same type as the cell 300. In this example, each of the columns of the matrix comprises two bit lines $BLT_0$, $BLF_0$, $BLT_1$, $BLF_1$, ..., and is controlled by a column decoder. The m*p memory cells are controlled by m word lines $WL_0$, $WL_1$ ....

Figure 12:
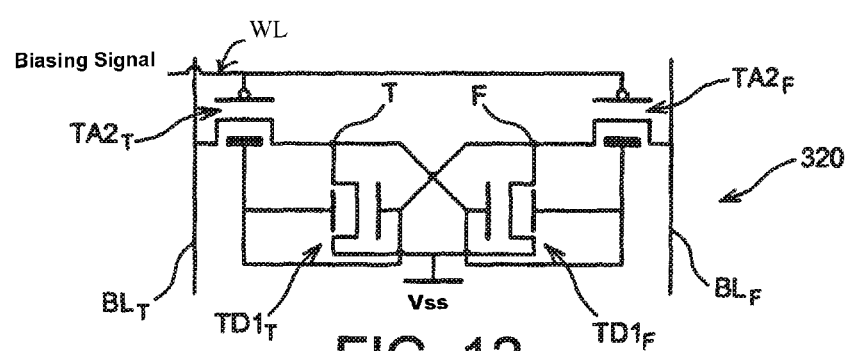
FIG. 12 illustrates another example of a 4T memory cell according to the invention implemented in a technology complementary to that of the cell in FIG. 9.

In FIG. 12, a second example of a cell 320 with four transistors, complementary to the first cell 300 described above, is given. In this example, the load transistors are replaced by dual-gate conduction transistors $TD1_T$, $TD1_F$, for example of the NMOS type. The conduction transistors $TD1_T$, $TD1_F$ are connected to a potential VSS. The cell 320 is also provided with access transistors $TA2_T$, $TA2_F$ implemented in a technology complementary to that of the access transistors of the first cell 300, for example in PMOS technology.

According to a variant embodiment, in the case where it is wished to favor stability of the cell in read mode, a device for refreshing the stored data can be associated with the cell. In this case, the behavior of the cell is dynamic.

To improve the stability of the cell in read mode, without impairing the retention stability, it is possible to reduce the potential of the word line WL activated in read mode, to a value of between Vss and Vdd.

Figure 13:
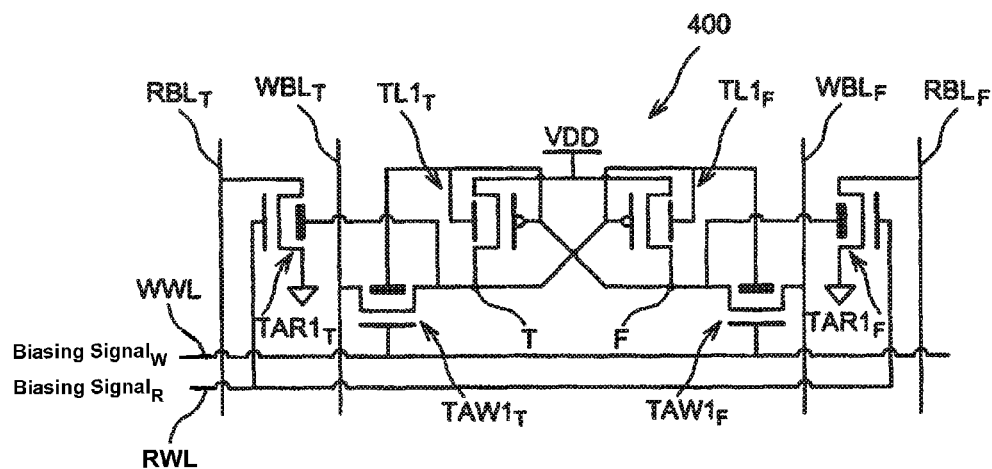
FIG. 13 illustrates an example of a 6T memory cell according to the invention provided with six dual-gate transistors including four asymmetric dual-gate access transistors, two word lines and four bit lines.

FIG. 13 illustrates an example of a memory cell 400 according to the invention provided with six transistors. This memory cell 400 has a core similar to that of the first example of a cell 300 described previously. In this figure, the first access transistor and the second access transistor are this time referenced respectively $TAW1_T$ and $TAW1_F$, while the first bit line and the second bit line are referenced respectively $WBL_T$ and $WBL_F$. The cell 400 comprises a word line WWL connected to the first gate of the first and second access transistor and is also provided with a second word line RWL, and two other bit lines $RBL_T$ and $RBL_F$. The cell 400 also comprises a third asymmetric dual-gate access transistor $TAR1_T$ and a fourth asymmetric dual-gate access transistor $TAR1_F$, both implemented for example in NMOS technology. The first gate of the third access transistor ($TAR1_T$) and the first gate of the fourth access transistor ($TAR1_F$) are connected to the second word line RWL. The second gate of the first access transistor is connected to the second storage node F, while the second gate of the second access transistor is connected to the first storage node T.

The second word line RWL, the third and fourth bit lines $RBL_T$ and $RBL_F$ and the third and fourth access transistors $TAR1_T$, $TAR1_F$ are dedicated to the operations of reading the cell 400. The first word line WWL, the bit lines $WBL_T$, $WBL_F$ as well as the first access transistor $TAW1_T$ and second access transistor $TAW1_F$ are dedicated to the writing operations.

An example of functioning of the 6-transistors memory cell 400 will now be given:

In retention mode, in which the memory cell retains its value, the second word line RWL is maintained at VSS or at a potential lower than VSS in order to reduce the leakage currents. The third and fourth bit lines $RBL_T$ and $RBL_F$ for their part can be pre-charged or charged initially to a potential VDD or left floating.

In read mode, the third and fourth bit lines $RBL_T$ and $RBL_F$ are pre-charged or charged initially to VDD or to a potential higher than VSS. Next, the second word line RWL is biased to VDD. The third access transistor $TAR1_T$, the second gate of which is connected to the first node T, allows a higher read current to pass than that passing through the fourth transistor $TAR1_F$, discharging the third bit line $RBL_T$ more rapidly. In this case, the cell 400 is particularly advantageous because the voltage of the first node T is not reduced by the read current. As a result the reading stability of the cell 400 is identical to its retention stability. Consequently the global stability of the cell 400 is greatly improved without having to make compromises between stability in retention mode and stability in read mode.

In write mode, in order to write for example a logic '0' state on the first node T, the second bit line $WBL_F$ is pre-charged to a potential VDD while the first bit line $WBL_T$ is maintained at VSS. Next the first word line WWL is biased to VDD in order to activate the access transistors and connect the storage nodes to the first and second bit lines $WBL_T$ and $WBL_F$. During the write cycle, the second word line RWL is maintained at VSS. In the case where the memory cell is used in a low-consumption mode and there is no memory access, in order to limit the leakage currents from the third and fourth access transistors $TAR1_T$ and $TAR1_F$, the third and fourth bit lines $RBL_T$ and $RBL_F$ can be maintained at earth in order to develop a zero potential difference between the drain and source of the access transistors $TAR1_T$ and $TAR1_F$.

Figure 14A:
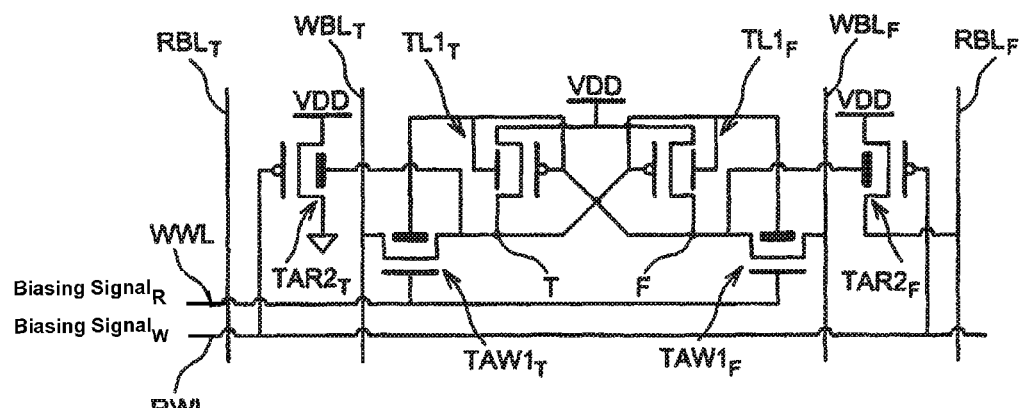
FIGS. 14A, 14B, 14C, illustrate variant embodiments of the 6T memory cell of FIG. 12.
Figure 14B:
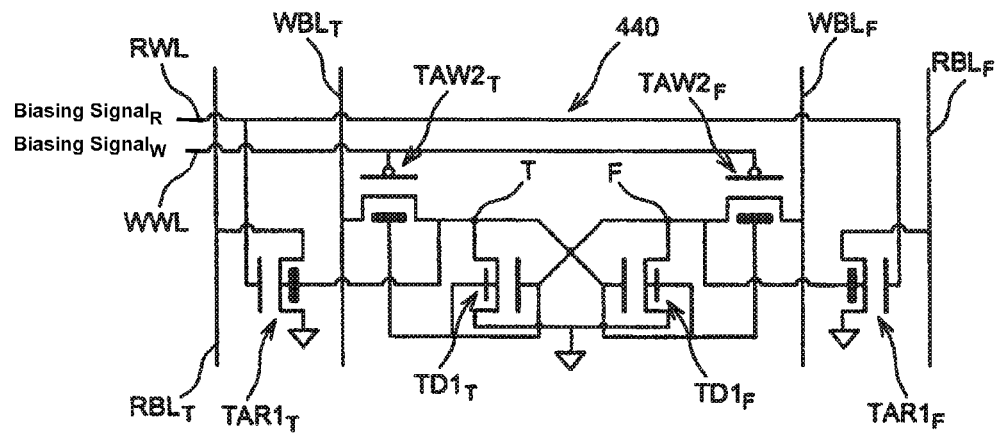
Figure 14C:
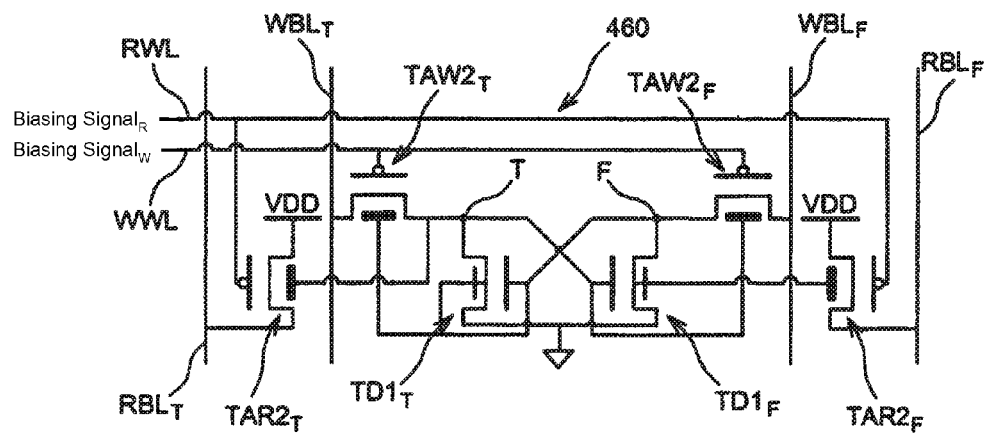

FIGS. 14A and 14C illustrate variant embodiments of the 6-transistors cell 400 that has just been described.

In FIG. 14A, a second example of a 6-transistors cell 420 is shown. This cell 420 differs from the cell 400 in that it comprises third and fourth access transistors $TAR2_T$ and $TAR2_F$ implemented in a technology, for example PMOS, complementary to that of the access transistors $TAR1_T$ and $TAR1_F$ of the cell 400, and connected between VDD and the third and fourth bit lines $RBL_T$ and $RBL_F$ as indicated. An example of an operating logic table of the cell 420 is given below:

|     | Retention | Read | Write |
| --- | --- | --- | --- |
| WWL | 0 | 0 | 1 |
| RWL | 1 | 0 | 1 |
| WBL | 0 | 0 | 0/1 |
| RBL | 0/1 | 0 | 0/1 |

In FIG. 14B, a third example of a 6-transistors cell 440 is shown. This cell 440 differs from the cell 400 in that the first and second access transistors $TAW2_T$ and $TAW2_F$ are implemented in a technology, for example PMOS, complementary to that of the access transistors $TAW1_T$ and $TAW1_F$ of the cell 400. The cell 440 also differs from the cell 400 in that it comprises two conduction transistors $TD1_T$ and $TD1_F$ in place of the load transistors $TL1_T$ and $TL1_F$.

An example of an operating logic table of the cell 440 is given below:

|     | Retention | Read | Write |
| --- | --- | --- | --- |
| WWL | 1 | 1 | 0 |
| RWL | 0 | 1 | 0 |
| WBL | 1 | 1 | 0/1 |
| RBL | 0/1 | 1 | 0/1 |

In FIG. 14C, a fourth example of a 6-transistors cell is given. This cell, referenced 460, differs from the cell 440 previously described in that it comprises third and fourth access transistors $TAR2_T$ and $TAR2_F$ implemented in a technology, for example PMOS, complementary to that of the access transistors $TAR1_T$ and $TAR1_F$ of the cell 440.

An example of an operating logic table of the cell 460 is given below:

|     | Retention | Read | Write |
| --- | --- | --- | --- |
| WWL | 1 | 1 | 0 |
| RWL | 1 | 0 | 1 |
| WBL | 1 | 1 | 0/1 |
| RBL | 0/1 | 0 | 0/1 |

A cell (not shown) with 6 transistors each provided with an asymmetric dual gate can also be used.

Figure 15:
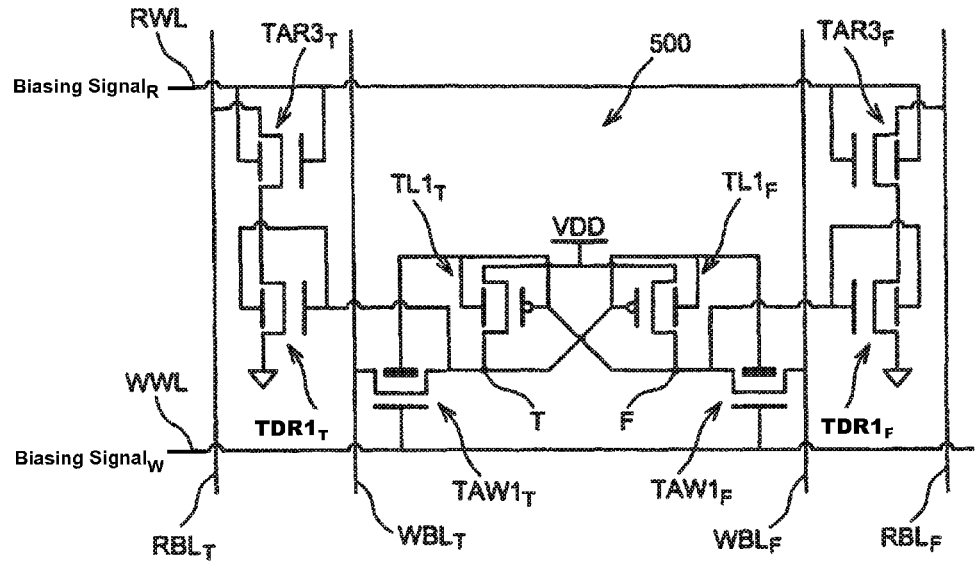
FIG. 15 illustrates an example of an 8T memory cell according to the invention provided with eight transistors, including four asymmetric dual-gate access transistors, as well as two word lines and four bit lines.

Another example of an access memory cell according to the invention is given in FIG. 15. This cell, referenced 500, referred to as "8T" or with 8 transistors, can be provided with a core similar to that of the cells with 4 transistors 300 or 6 transistors 400 described previously. Compared with the 6-transistors cell 400, the cell 500 comprises an additional transistor $TDR1_T$ connected between the third access transistor and earth, and another additional transistor $TDR1_F$, connected between the fourth access transistor and earth. In this example, the third and fourth access transistors are denoted $TAR3_T$, $TAR3_F$ and are of the symmetrical dual-gate type, which limits the leakage currents. The two additional transistors $TDR_T$ and $TDR_F$ can also be provided with a symmetrical dual gate. In this example, the dual gates of the third access transistor $TAR_T$ and of the fourth access transistor $TAR_F$ are controlled by the second word line RWL. The dual gate of the additional transistor $TDR1_T$ is connected to the first storage node T, while the dual gate of the other additional transistor $TDR1_F$ is connected to the second storage node F.

An example of functioning of the cell 500 is as follows:

In read mode, the third and fourth bit lines $RBL_T$ and $RBL_F$ are pre-charged to a potential VDD. When the second word line RWL of the cell 500 is activated, the third bit line $RBL_T$ discharges via the third access transistor $TAR3_T$ and the transistor $TDR1_T$ while the fourth bit line $RBL_F$ is maintained at a potential VDD because the transistor $TDR1_F$ is in an off state. The functioning in write mode of this cell 500 is similar to that of the cell 400. In so-called "standby" mode in which there is no access to the memory in write or read mode, in order to limit the leakage currents of the transistors $TAR3_T$, $TAR3_F$, $TDR1_T$ and $TDR1_F$, the third and fourth bit lines $RBL_T$ and $RBL_F$ can be maintained at earth in order to develop a zero potential difference between the drain of the transistors and the source of these transistors.

Figure 16A:
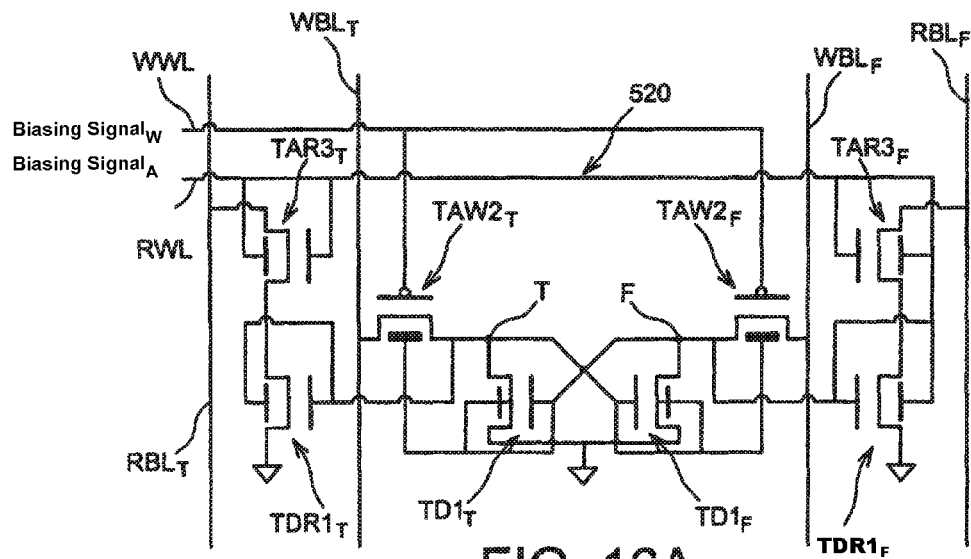
FIGS. 16A, 16B, 16C illustrate variant embodiments of the 8T memory cell at FIG. 14.
Figure 16B:
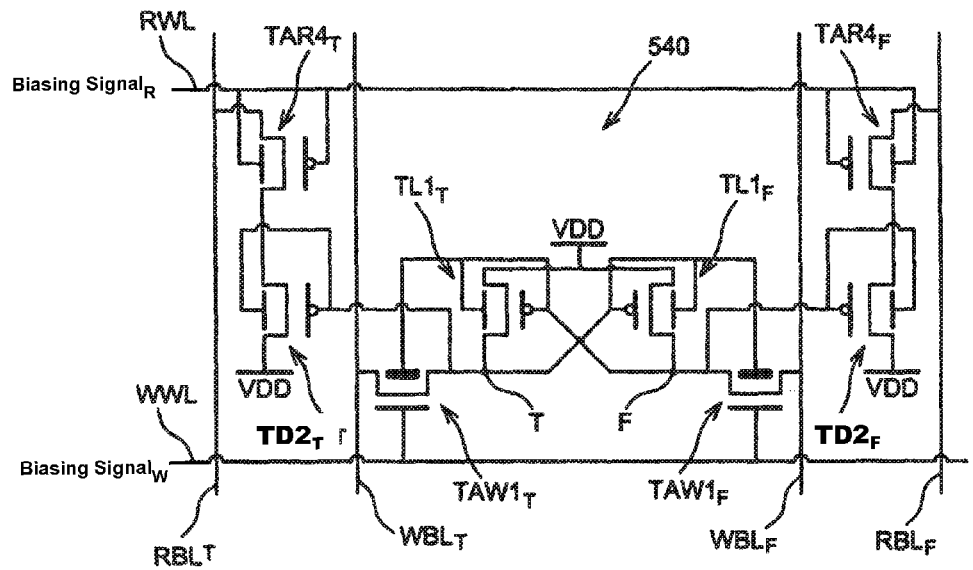
Figure 16C:
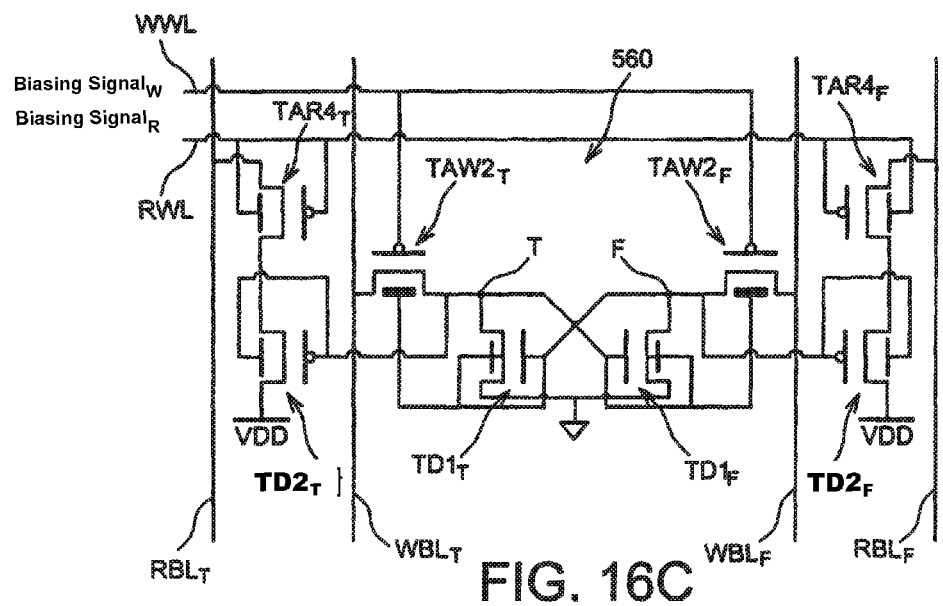

FIGS. 16A to 16C illustrate variant embodiments of the 8-transistor cell 500 that has just been described.

In FIG. 16A, a second example of an 8-transistor cell 520 is shown and differs from the cell 500 in that it comprises first and second access transistors $TAW2_T$ and $TAW2_F$ implemented in a technology, for example PMOS, complementary to that of the access transistors $TAW1_T$ and $TAW1_F$ of the cell 500.

The 8-transistor cell 520 also differs from the cell 500 in that it comprises two transistors $TD1_T$ and $TD1_F$ implemented in a technology, for example NMOS, complementary to that of the transistors $TL1_T$ and $TL1_F$ of the cell 500.

An example of an operating logic table of the cell 520 is given below:

|     | Retention | Read | Write |
| --- | --- | --- | --- |
| WWL | 1 | 1 | 0 |
| RWL | 0 | 1 | 0 |
| WBL | 1 | 1 | 0/1 |
| RBL | 0/1 | 1 | 0/1 |

In FIG. 16B, a third example of an 8-transistor cell 540 is shown. This cell 540 differs from the cell 500 in that the third and fourth access transistors referenced TAR4$_T$ and TAR4$_F$ are implemented in a technology, for example PMOS, complementary to that of the access transistors TAR3$_T$ and TAR3$_F$ of the cell 500. The cell 540 also differs from the cell 400 in that it comprises two conduction transistors TD2$_T$ and TD2$_F$ implemented in a technology, for example PMOS, complementary to that of the transistors TDR1$_T$ and TDR1$_F$ of the cell 500.

$W_D$ and $L_D$ designate respectively the widths and lengths of the conduction transistors, $W_A$ and $L_A$ designate respectively the widths and length of the access transistors, $W_{RA}$ and $L_{RA}$ designate respectively the widths and length of the additional access transistors, $W_{RD}$ and $L_{RD}$ designate respectively the widths and length of the additional conduction transistors.

For the 6-transistors cell 400 and the 8-transistor cell 500, the stability criterion has been achieved for a sizing with a minimum channel width $W_{min}$=76 nm, and a channel length $L_{min}$=32 nm, for the load and access transistors.

| Geometry (nm) | $W_L$ | $L_L$ | $W_D$ | $L_D$ | $W_A$ | $L_A$ | $W_{RA}$ | $L_{RA}$ | $W_{RD}$ | $L_{RD}$ |
|---|---|---|---|---|---|---|---|---|---|---|
| Stand-6T. | 76 | 32 | 134 | 32 | 110 | 42 | — | — | — | — |
| Cell 300 | 130 | 32 | — | — | 76 | 40 | — | — | — | — |
| Cell 400 | 76 | 32 | — | — | 76 | 32 | 76 | 42 | — | — |
| Cell 500 | 76 | 32 | — | — | 76 | 32 | 76 | 32 | 76 | 32 |

An example of an operating logic table of the cell 540 is given below:

|  | Retention | Read | Write |
|---|---|---|---|
| WWL | 0 | 0 | 1 |
| RWL | 1 | 0 | 1 |
| WBL | 0 | 0 | 0/1 |
| RBL | 0/1 | 0 | 0/1 |

In FIG. 16C, a fourth example of an 8-transistor cell is given. This cell, referenced 560, differs from the cell 540 previously described in that it comprises first and second access transistors TAW2$_T$ and TAW2$_F$ implemented in a technology, for example PMOS, complementary to that of the first and second access transistors TAW1$_T$ and TAW1$_F$ of the cell 540.

The cell 560 also differs from the cell 540 in that it comprises two conduction transistors TD1$_T$ and TD1$_F$ implemented in a technology, for example NMOS, complementary to that of the transistors TL1$_T$ and TL1$_F$ of the cell 540.

An example of an operating logic table for the cell 540 is given below:

|  | Retention | Read | Write |
|---|---|---|---|
| WWL | 1 | 1 | 0 |
| RWL | 1 | 0 | 1 |
| WBL | 1 | 1 | 0/1 |
| RBL | 0/1 | 0 | 0/1 |

A cell (not shown) with 8 transistors each provided with an asymmetric dual gate can also be used.

Comparative examples of the performances of the cells 300, 400, 500 described previously, compared with those of a 6-transistors cell used according to the prior art, referred to as "standard 6T", will now be given. These comparative results were obtained for a 32 nm technology with a critical gate dimension, with a supply voltage VDD=1V, a temperature T=27° C. The sizing of the transistors in each of the cells is given in the following table, in which:

$W_L$ and $L_L$ designate respectively the width and length of the load transistors, The 4-transistors memory cell 300 makes it possible to balance the static noise margin (SNM) and the reading noise margin (RNM) above 200 mV whilst keeping a high density.

Compared with a standard 6T cell, the write margin (WM) of the cell 300 is improved by around 68% for a saving in surface area of greater than 55%. The leakage currents are also improved by 9.5% for this cell 300 compared with the standard 6T cell.

The cells 400 and 500 makes it possible to approach a static noise margin SNM of around 300 mV, that is to say 50% greater than that of the standard 6T cell. The minimum sizing of the core of these cells 400 and 500 improves the write margin by 74%. In a mode in which there is no read or write access to the cell or in the case of low-consumption applications, the retention leakage current $I_{OFF}$ of the cells 400 and 500 is decreased by 28% compared with the standard 6T cell. The size of the transistors leads to a sizing of the cells at least 25% less than that of the standard 6T cell. The cells 400 and 500 make it possible to obtain a good compromise between the leakage current of the access transistors ($I_{PG}$) and the conduction current of the cell in read mode ($I_{CELL}$), which results in a factor NBL, NBL being equal to the ratio ($I_{CELL}/I_{PG}$) increased by more than 40% compared with a standard 6T cell.

DOCUMENTS CITED

[TAK01]: K. Takeuchi, et al., <<*A Study of Threshold Voltage Variation for Ultra SmallBulk and SOI CMOS*>>, IEEE TED, VOL. 48, No. 9, September 2004.

[YAM04]: M. YAMAOKA, et al., <<Low Power SRAM Menu for SOC Application Using Yin-Yang-Feedback memory Cell Technology>>, Symposium on VLSI circuits, Digest of Technical Papers, Honolulu, USA, June 2004.

[KIM05]: J. J. KIM, et al., <<*Back-Gate Controlled READ SRAM with Improved Stability*>>, IEEE SOI CONFERENCE, pp. 211-212, Hawaii, USA, 2005.

[CHA'01]: A. CHANDRAKASAN, et al., <<*Design of High-Performance Microprocessor Circuits*>>, IEEE press, pp. 285-308, FOX 2001.

[CEA03]: O. THOMAS, A. AMARA <<Static random access memory (SRAM) cell, and ultra low consumption memory unit produced from such cells", French Patent, CEA-LETI, April 2003.

[MOS02]: W. LEUNG, et al., <<High-Density ratio-Independent Four-Transistor RAM Cell Fabricated with Conventional Logic Process >>, U.S. Pat. No. 6,442,060 B1, Monolithic System Technology, August 2002.

[TI02]: X. Deng, et al., <<Loadless 4T SRAM cell with PMOS Drivers >>, U.S. Pat. No. 0,051,379 A1, Texas Instruments, May 2002.

The invention claimed is:

1. A random access memory cell comprising:
at least a plurality of symmetrical dual-gate transistors coupled to storage nodes and forming a flip-flop, each of the plurality of symmetrical dual-gate transistors having two gates;
at least a first asymmetric dual-gate access transistor and at least a second dual-gate access transistor disposed respectively between a first bit line and a first storage node, and between a second bit line and a second storage node, a first gate of the first access transistor and a first gate of the second access transistor being connected to a first word line able to route a biasing signal, a second gate of the first access transistor being connected to the second storage node and a second gate of the second access transistor being connected to the first storage node,
wherein each gate of a dual-gate transistor is made of at least a block based on at least one gate material, each dual-gate transistor having its first gate, a semiconductor active zone and its second gate superimposed or juxtaposed on a support, and
wherein each asymmetric dual-gate transistor is such that the current delivered between the drain and the source of the transistor is different depending on whether the first gate or the second gate is activated, for an identical biasing, and
wherein each symmetrical dual-gate transistor is such that the current delivered between the drain and the source of the transistor is identical depending on whether the first gate or the second gate is activated, for an identical biasing.

2. The random access memory cell according to claim 1, said plurality of symmetrical dual-gate transistors comprising:
a first symmetrical dual-gate load transistor and a second symmetrical dual-gate load transistor, the two gates of the first symmetrical dual-gate load transistor being connected together and to the second storage node, the two gates of the second symmetrical dual-gate load transistor being connected together and to the first storage node,
or
a first symmetrical dual-gate conduction transistor and a second symmetrical dual-gate conduction transistor, the first and second symmetrical dual-gate conduction transistors each having two gates, the two gates of the first symmetrical dual-gate conduction transistor being connected together and to the second storage node, and the two gates of the second symmetrical dual-gate conduction transistor being connected together and to the first storage node.

3. The random access memory cell according to claim 1, further comprising:
a second word line,
third and fourth bit lines,
third and fourth dual-gate access transistors connected to the second word line and connected respectively to the third bit line and to the fourth bit line, the third and fourth dual-gate access transistors each having two gates.

4. The random access memory cell according to claim 3, in which a first gate of the third dual-gate access transistor and a first gate of the fourth dual-gate access transistor are connected to the second word line able to route a biasing signal, a second gate of the third dual-gate access transistor being connected to the first one of the storage nodes and a second gate of the fourth dual-gate access transistor being connected to the second one of the storage nodes.

5. The random access memory cell according to claim 3, wherein the two gates of one or both the third and fourth dual-gate transistors are connected to the second word line, the cell further comprising:
a fifth dual-gate transistor coupled between the third dual-gate access transistor and the first node, the fifth dual-gate transistor having two gates that are connected to each other,
a sixth dual-gate transistor coupled between the fourth dual-gate access transistor and the second node, the sixth dual-gate transistor having two gates that are connected to each other.

6. The random access memory cell according to claim 5, wherein the fifth and sixth dual-gate transistors each has symmetrical dual gates.

7. The random access memory cell according to claim 1, wherein the first gate block, the active semiconductor zone and the second gate block are superimposed on a substrate.

8. The random access memory cell according to claim 1, wherein the first gate block is separated from the semiconductor active zone by a first block of dielectric material of a prescribed thickness, and the second gate block is separated from the semiconductor active zone by a second block of dielectric material with a thickness greater that the prescribed thickness.

9. A random access memory cell comprising:
a plurality of symmetrical dual-gate transistors coupled to storage nodes and comprising a flip-flop, each of the plurality of symmetrical dual-gate load transistors having two gates; and
a first asymmetric dual-gate access transistor disposed between a first bit line and a first one of the storage nodes, and a second asymmetric dual-gate access transistor disposed between a second bit line and a second one of the storage nodes, the first and second asymmetric dual-gate access transistors each having two gates, a first gate of the first asymmetric dual-gate access transistor and a first gate of the second asymmetric dual-gate access transistor being connected to a first word line able to route a biasing signal, a second gate of the first asymmetric dual-gate access transistor being connected to the second one of the storage nodes and a second gate of the second asymmetric dual-gate access transistor being connected to the first one of the storage nodes,
wherein the two gates of at least one of the first and second asymmetric dual-gate access transistors are formed respectively by a first gate block and a second gate block on each side of an active semiconductor zone, and
wherein the first gate block is of a given composition and the second gate block is of a composition different from the given composition.

10. The random access memory cell comprising:
a plurality of symmetrical dual-gate transistors coupled to storage nodes and comprising a flip-flop, each of the plurality of symmetrical dual-gate load transistors having two gates; and
a first asymmetric dual-gate access transistor disposed between a first bit line and a first one of the storage nodes, and a second asymmetric dual-gate access transistor disposed between a second bit line and a second one of the storage nodes, the first and second asymmetric dual-gate access transistors each having two gates, a first gate of the first asymmetric dual-gate access transistor and a first gate of the second asymmetric dual-gate access transistor being connected to a first word line able to route a biasing signal, a second gate of the first asymmetric dual-gate access transistor being connected to the second one of the storage nodes and a second gate of the second asymmetric dual-gate access transistor being connected to the first one of the storage nodes, wherein the two gates of at least one of the first and second asymmetric dual-gate access transistors are formed respectively by a first gate block and a second gate block on each side of an active semiconductor zone, the first gate block, the active semiconductor zone, and the second gate block being juxtaposed on a substrate, and wherein the first gate block has a prescribed critical dimension, and the second gate block has a critical dimension different from said prescribed critical dimension.

11. The random access memory cell according to claim 10, wherein the first gate block is separated from the semiconductor active zone by a first block of dielectric material of prescribed thickness, and the second gate block is separated from the semiconductor active zone by a second block of dielectric material with a thickness greater that the prescribed thickness.

12. The random access memory cell according to claim 10, wherein the second gate block belongs to said second gate, and the first gate block belongs to said first gate.

13. A random access memory cell comprising:
a plurality of symmetrical dual-gate transistors coupled to storage nodes and comprising a flip-flop, each of the plurality of symmetrical dual-gate load transistors having two gates; and
a first asymmetric dual-gate access transistor disposed between a first bit line and a first one of the storage nodes, and a second asymmetric dual-gate access transistor disposed between a second bit line and a second one of the storage nodes, the first and second asymmetric dual-gate access transistors each having two gates, a first gate of the first asymmetric dual-gate access transistor and a first gate of the second asymmetric dual-gate access transistor being connected to a first word line able to route a biasing signal, a second gate of the first asymmetric dual-gate access transistor being connected to the second one of the storage nodes and a second gate of the second asymmetric dual-gate access transistor being connected to the first one of the storage nodes, wherein the two gates of at least one of the first and second asymmetric dual-gate access transistors are formed respectively by a first gate block and a second gate block on each side of an active semiconductor zone, the first gate block, the active semiconductor zone, and the second gate block being juxtaposed on a substrate, and wherein the first gate block is of a prescribed composition and the second gate block is of a composition different from the prescribed composition.

14. A memory, comprising a plurality of cells, each cell comprising:
a plurality of symmetrical dual-gate transistors coupled to storage nodes and comprising a flip-flop, each of the plurality of symmetrical dual-gate load transistors having two gates; and
a first asymmetric dual-gate access transistor disposed between a first bit line and a first one of the storage nodes, and a second asymmetric dual-gate access transistor disposed between a second bit line and a second one of the storage nodes, the first and second asymmetric dual-gate access transistors each having two gates, a first gate of the first asymmetric dual-gate access transistor and a first gate of the second asymmetric dual-gate access transistor being connected to a first word line able to route a biasing signal, a second gate of the first asymmetric dual-gate access transistor connected to the second one of the storage nodes and a second gate of the second asymmetric dual-gate access transistor connected to the first one of the storage nodes wherein the two gates of at least one of the first and second asymmetric dual-gate access transistors are formed respectively by a first gate block and a second gate block on each side of an active semiconductor zone, and wherein the first gate block has a prescribed critical dimension, and the second gate block has a critical dimension different from said prescribed critical dimension.

15. The memory of claim 14, the memory comprising an SRAM.

* * * * *